US012681083B2

(12) United States Patent
Vogel et al.

(10) Patent No.: US 12,681,083 B2
(45) Date of Patent: Jul. 14, 2026

(54) METHOD FOR CHECKING AT LEAST ONE FIRST CLOCK GENERATOR OF A FIRST FIELD DEVICE IN A PROCESS MEASURING SYSTEM

(71) Applicant: Endress+Hauser SE+Co. KG, Maulburg (DE)

(72) Inventors: Alexander Vogel, Kirchzarten (DE); Alexey Malinovskiy, Maulburg (DE); Lars Karweck, Binzen (DE); Sascha D'Angelico, Rümmingen (DE); Volker Frey, Schopfheim (DE); Tanja Haag, Schopfheim (DE); Christoph Schmitt, Schopfheim (DE); Nicolas Schönborn, Rietberg (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 162 days.

(21) Appl. No.: 18/852,584

(22) PCT Filed: Mar. 28, 2023

(86) PCT No.: PCT/EP2023/057902
§ 371 (c)(1),
(2) Date: Sep. 30, 2024

(87) PCT Pub. No.: WO2023/194143
PCT Pub. Date: Oct. 12, 2023

(65) Prior Publication Data
US 2025/0224448 A1 Jul. 10, 2025

(30) Foreign Application Priority Data
Apr. 6, 2022 (DE) ..................... 10 2022 108 316.0

(51) Int. Cl.
*G01R 31/317* (2006.01)

(52) U.S. Cl.
CPC .............................. *G01R 31/31727* (2013.01)

(58) Field of Classification Search
CPC ................................................. G01R 31/31727
See application file for complete search history.

(56) References Cited

U.S. PATENT DOCUMENTS

| | | | | | |
|---|---|---|---|---|---|
| 4,078,419 | A | * | 3/1978 | Busch | G04D 7/1214 |
| | | | | | 968/771 |
| 8,564,379 | B2 | * | 10/2013 | Drotleff | G01R 31/2824 |
| | | | | | 375/130 |
| 10,209,099 | B2 | * | 2/2019 | Von Berg | G01D 5/244 |

FOREIGN PATENT DOCUMENTS

| | | |
|---|---|---|
| DE | 102012108864 A1 | 3/2014 |
| DE | 102016117007 A1 | 3/2018 |

(Continued)

*Primary Examiner* — Walter L Lindsay, Jr.
*Assistant Examiner* — Milton Gonzalez
(74) *Attorney, Agent, or Firm* — Mark A. Logan; Endress+Hauser (USA) Holding, Inc.

(57) ABSTRACT

A method for checking a first clock signal generator of a first field device in a process measuring system that includes the first field device and at least two other field devices having, in each case, a clock signal generator comprises producing an actual frequency of the first clock signal generator, transmitting the produced actual frequency and the desired frequency of the first clock signal generator to the two other field devices, ascertaining deviations of the actual frequency from the desired frequency via the clock signal generators of the two other field devices, transmitting the ascertained deviations to the first field device, comparing the ascertained deviations and/or an average value of the ascertained deviations with a predetermined tolerance range of the desired frequency of the at least first clock signal generator, and outputting state information concerning the first clock signal generator based on the comparison.

12 Claims, 1 Drawing Sheet

(56)     References Cited

FOREIGN PATENT DOCUMENTS

| | | | |
|----|----------------|-----|---------|
| DE | 102016222618 | A1 | 5/2018 |
| EP | 1256858 | A2 | 11/2002 |
| EP | 1903681 | A1 | 3/2008 |
| WO | 2009062535 | A1 | 5/2009 |

* cited by examiner

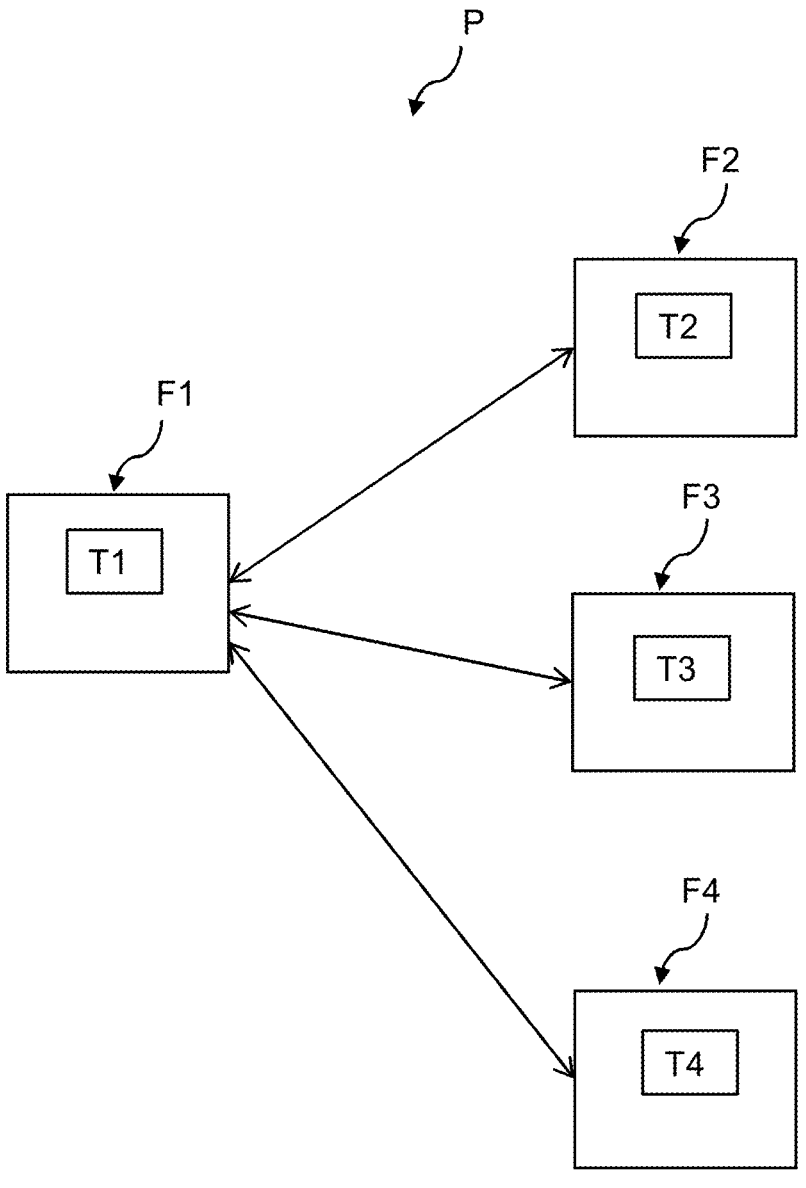

METHOD FOR CHECKING AT LEAST ONE FIRST CLOCK GENERATOR OF A FIRST FIELD DEVICE IN A PROCESS MEASURING SYSTEM

CROSS-REFERENCE TO RELATED APPLICATIONS

The present application is related to and claims the priority benefit of DPMA Patent Application No. 10 2022 108 316.0, filed on Apr. 6, 2022, and International Patent Application No. PCT/EP2023/057902, filed Mar. 28, 2023, the entire contents of which are incorporated herein by reference.

TECHNICAL FIELD

The invention relates to a method for checking at least a first clock signal generator of a first field device in a process measuring system, wherein the process measuring system includes the first field device and at least two other field devices having, in each case, at least one clock signal generator, wherein each field device determines and/or monitors at least one chemical and/or physical parameter of a medium, wherein a desired frequency is predetermined for each clock signal generator and each clock signal generator produces an actual frequency, wherein the first field device is embodied to exchange information with the at least two other field devices.

BACKGROUND

In automation technology, especially in process automation technology, field devices are often applied, which serve for registering and/or influencing process variables. Serving for registering process variables are sensors, such as, for example, fill level measuring devices, flow measuring devices, pressure- and temperature measuring devices, pH- and redox potential measuring devices, conductivity measuring devices, etc., which register the corresponding process variables, fill level, flow, pressure, density, temperature, pH value, and conductivity. Serving for influencing process variables are actuators, such as, for example, valves or pumps, via which the flow of a liquid in a pipeline section, or the fill level in a container, can be changed. Referred to as field devices are all devices, which are applied near to a process and which deliver, or process, process relevant information. In connection with the invention, the terminology, field devices, thus, refers especially also to remote I/Os, power supplies, radio adapters, and, in general, devices, which are arranged at the field level.

A field device comprises typically a sensor, at least partially and/or at least at times in contact with the process, and an electronics, which serves, for example, for signal registration, signal evaluation and/or signal feed. The electronics of the field device is typically arranged in a housing and has supplementally at least one connecting element for connecting the electronics to the sensor and/or to an external unit. The connecting element can be any connection. Thus, even a wireless connection can be used. The electronics and the sensor of the field device can be embodied as separate units with separate housings or as a common unit in a single housing.

Field devices can be equipped with one or more clock signal generators, which output a clock signal in the form of a frequency. The clock signal generator includes, as a rule, a quartz oscillator, which is distinguished by an especially high accuracy. However, also other clock signal generators can, in principle, be applied. The clock signal output by the clock signal generator can be applied for time synchronization of actions of a plurality of circuits and plays a role, consequently, especially for field devices, in the case of which the point in time or length of time for determining the at least one chemical and/or physical parameter of a medium is a relevant influencing variable. Such are field devices, for example, travel time measuring devices, which determine a fill level or flow of a medium by means of transmitting, for example, radar waves or ultrasonic waves, as well as density measuring devices. The accuracy of the clock signal predetermined by the clock signal generator in the case of such field devices acts directly on the accuracy of the determined parameter of the medium.

In order to check or calibrate a clock signal generator of a field device, such has previously been tested at regular intervals using an external reference clock signal generator, which meant that the field device had to be removed from its measuring point. Alternatively, redundant clock signal generators are installed as reference clock signal generators in the field device. This creates a need for additional circuits, space and power supply.

SUMMARY

An object of the invention is, consequently, to provide a method, by which a clock signal generator can, in simple manner, be checked.

The object is achieved according to the invention by a method for checking at least a first clock signal generator of a first field device in a process measuring system, wherein the process measuring system includes the first field device and at least two other field devices having, in each case, at least one clock signal generator, wherein each field device determines and/or monitors at least one chemical and/or physical parameter of a medium, wherein a desired frequency is predetermined for each clock signal generator and each clock signal generator produces an actual frequency, wherein the first field device is embodied to exchange information with the at least two other field devices, wherein the method comprises at least method steps as follows:

producing an actual frequency of the at least first clock signal generator, transmitting the produced actual frequency and the desired frequency of the at least first clock signal generator to the at least two other field devices, ascertaining deviations of the actual frequency from the desired frequency of the at least first clock signal generator by means of the clock signal generators of the at least two other field devices, transmitting the ascertained deviations to the first field device, comparing the ascertained deviations and/or an average value of the ascertained deviations with a predetermined tolerance range of the desired frequency of the at least first clock signal generator, outputting at least one piece of state information concerning the at least first clock signal generator based on the comparison.

By means of the method of the invention, the at least first clock signal generator of the first field device is checked, in simple manner, on-site with the help of other field devices each equipped with at least one clock signal generator. A removal of the first field device is not necessary in such case. Instead, the method can be performed within the process measuring system. In such case, the at least first clock signal generator is provided with a predetermined tolerance range of the desired frequency. So long as the actual frequency of the at least first clock signal generator lies within the predetermined tolerance range of the desired frequency of the at least first clock signal generator, a desired accuracy of the at least first clock signal generator is present. However, the accuracy of the first clock signal generator can worsen with time, such that the first clock signal generator can output an actual frequency, which differs from its desired frequency. In the case of a leaving of the predetermined tolerance range of the desired frequency by the actual frequency, the accuracy of the at least first clock signal generator is no longer acceptable.

At least two other field devices are used for checking the at least first clock signal generator. The at least two other clock signal generators of the at least two other field devices have likewise each an actual frequency and a desired frequency and utilize especially their actual frequencies, in order to compare the actual frequency of the at least first clock signal generator with the desired frequency of the at least first clock signal generator. The deviations ascertained in such case are then compared with the predetermined tolerance range of the desired frequency of the at least first clock signal generator. Alternatively, an average value of the ascertained deviations can be formed and this compared with the predetermined tolerance range of the desired frequency of the at least first clock signal generator. Based on such comparison, finally, at least one piece of state information concerning the at least first clock signal generator is output.

The at least two clock signal generators of the at least other two field devices can likewise have deviations of their actual frequencies from the desired frequencies predetermined for them. The method of the invention is, consequently, more precise, the greater the number of other field devices applied for checking the first clock signal generator. In order to take possible deviations of the at least two other clock signal generators into consideration, advantageously especially an average value of the ascertained deviations is formed and this compared with the predetermined tolerance range of the desired frequency of the at least first clock signal generator.

In an embodiment, a warning is output as at least one piece of state information concerning the at least first clock signal generator, when the ascertained deviations and/or the average value of the ascertained deviations lie outside of the predetermined tolerance range of the desired frequency. Based on the warning, for example, an operator can detect that a failure of the at least first clock signal generator is present and can, in given cases, introduce countermeasures, such as a calibration or a maintenance step.

In an additional embodiment, a correction factor is output as at least one piece of state information concerning the at least first clock signal generator, wherein the correction factor gives the degree with which the at least first clock signal generator differs from the predetermined tolerance range. Based on the correction factor, it can be detected, to what extent or how much the actual frequency of the at least first clock signal generator differs from the predetermined tolerance range of the desired frequency of the at least first clock signal generator.

In an additional embodiment, output as at least one piece of state information concerning the at least first clock signal generator is a remaining function length of time of the at least first clock signal generator, after expiration of which the ascertained deviations and/or the average value of the ascertained deviations will lie outside of the predetermined tolerance range. In this way, it can be ascertained or at least estimated, how long the at least first clock signal generator will still produce an actual frequency, which lies within the predetermined tolerance range of the desired frequency. Based on the remaining function length of time, for example, it can be planned in predictive manner for maintenance or calibration of the at least first clock signal generator.

In a further development, the actual frequency of the at least first clock signal generator is corrected to the desired frequency with the help of the ascertained deviations and/or the average value of the ascertained deviations and/or the correction factor. The correction of the actual frequency of the at least first clock signal generator can be performed, for example, while the first field device is mounted at its measuring point in the process measuring system. Alternatively, the field device can be removed from its measuring point for the correction. The correction of the actual frequency of the at least first clock signal generator can especially be performed by means of software present in the first field device or hardware present in the first field device.

An embodiment provides that the first field device determines and/or monitors at least one chemical and/or physical parameter of the medium at least by means of the at least first clock signal generator. The accuracy of the at least first clock signal generator acts, thus, directly on the accuracy of the determined and/or monitored parameter.

Preferably, each ascertained deviation is weighted as a function of the field device, by which it was ascertained. The at least two clock signal generators of the at least two field devices, each of which ascertains a deviation, can analogously to the at least first clock signal generator produce in the course of time an actual frequency, which differs from its desired frequency. In order to take an, in given cases present, particular deviation of the actual frequency from the desired frequencies of the at least two clock signal generators of the at least two other field devices into consideration, the ascertained deviations are weighted, wherein each deviation is weighted separately, depending on the field device, by which it was ascertained.

Especially, each ascertained deviation is weighted as a function of a piece of state information of the field device, by which it was ascertained.

Advantageously used as state information of the field device are/is a time period since the last calibration of the clock signal generator of a field device and/or the presence of a failure and/or a need for maintaining the field device and/or an accuracy class of the at least one clock signal generator of the field device. If it is, for example, as state information of the field device known that a failure of the field device is present or that the field device needs maintenance, then the deviation ascertained by the field device is probably less accurate than in the opposite cases, when the field device is fully capable of functioning and free of maintenance requirements. Correspondingly, a deviation ascertained by a field device with an existing failure or need for maintenance can be weighted lower than in case of a failure- or maintenance free field device. Also, it can be assumed that with an increasing length of the period of time since the last calibration of the clock signal generator, the deviation ascertained by the clock signal generator, or field device, becomes less accurate. Accordingly, deviations, which were ascertained by field devices having a shorter time period since the last calibration of their clock signal generators, can be weighted more than deviations, which were ascertained by field devices having a longer time period since the last calibration of their clock signal generators. Less greatly weighted ascertained deviations have a lower influence on the comparison between the ascertained deviations and/or an average value of the ascertained deviations with a predetermined tolerance range of the desired frequency of the at least first clock signal generator.

In an embodiment, an accuracy class of the first clock signal generator is used as predetermined tolerance range of the at least first clock signal generator. Especially, quartz oscillators are produced, for example, in different accuracy classes.

In an additional embodiment, a density measuring device, a flow measuring device or a travel time fill level measuring device is used as the first field device. A travel time fill level measuring device determines and/or monitors the fill level of a medium, for example, with the help of ultrasonic waves or radar. A precise measuring of the travel time assumes an exact clock signal generator, thus an exact clock signal generator of the first field device. Also flowmeters need an exact measuring of time. This is true especially in the case of flow measuring devices, which apply travel time technologies for determining the flow, however, also e.g. for Coriolis flow measuring devices or vortex flowmeters, since in the case of these flows measuring devices, the flow is determined based on frequencies, which, thus, need an exact time-, thus frequency, measurement. Density measuring devices, in turn, determine the density of a medium. Applied as density measuring devices are, for example, bending oscillators, e.g. oscillatory forks, which determine the density of a medium based on a change of their resonant frequency. For exact frequency determination, likewise a more precise clock signal generator is necessary.

The object is further achieved according to the invention by a method for checking at least a first clock signal generator of a first field device in a process measuring system, wherein the process measuring system includes the first field device and at least two other field devices having, in each case, at least one clock signal generator, wherein each field device determines and/or monitors at least one chemical and/or physical parameter of a medium, wherein a desired frequency is predetermined for each clock signal generator and each clock signal generator produces an actual frequency, wherein the first field device is embodied to exchange information with the at least two other field devices, wherein the method comprises at least method steps as follows:

producing an actual frequency of the at least first clock signal generator, transmitting the produced actual frequency of the at least first clock signal generator to the at least two other field devices, checking the actual frequency of the at least first clock signal generator by means of the clock signal generators of the at least two other field devices, determining reference frequencies of the at least first clock signal generator as result of checking the actual frequency of the at least first clock signal generator, transmitting the reference frequencies to the first field device, ascertaining deviations of the reference frequencies from the desired frequency of the at least first clock signal generator, comparing the ascertained deviations and/or an average value of the ascertained deviations with a predetermined tolerance range of the desired frequency of the at least first clock signal generator, and outputting at least one piece of state information concerning the at least first clock signal generator based on the comparison.

The embodiments of the first method of the invention hold mutatis mutandis for the second method of the invention.

The second method of the invention is an alternative for the first method of the invention. The two methods differ concerning which field device, or which field devices, ascertain the deviations. In the first method of the invention, the deviations are ascertained by the at least two other field devices, for which purpose besides the actual frequency of the at least first clock signal generator also the desired frequency of the at least first clock signal generator is transmitted to the at least two other field devices.

In the second method of the invention, the first field device ascertains the deviations based on information transmitted from the at least two other field devices. Only the actual frequency of the at least first clock signal generator is transmitted to the at least two other field devices, which then check the actual frequency of the at least first clock signal generator especially by means of the actual frequencies of their clock signal generators and then determine reference frequencies. In other words, the clock signal generators of the at least two other field devices determine the frequency of the actual frequency of the at least first clock signal generator based on their particular actual frequencies. The so determined frequencies are then called the reference frequencies, since they are the actual frequency of the at least first clock signal generator referenced to the clock signal generators of the at least two other field devices. The reference frequencies are transmitted to the first field device, which ascertains the deviations between the reference frequencies and the desired frequency of the at least first clock signal generator. Based on a comparison between the ascertained deviations and/or an average value of the ascertained deviations with a predetermined tolerance range of the desired frequency of the at least first clock signal generator, finally, at least one piece of state information concerning the at least first clock signal generator is output.

Thus, by means of the second method of the invention, the at least first clock signal generator can be checked, in simple manner, within the process measuring system. Advantages of the first method of the invention hold exactly so for the second method of the invention.

BRIEF DESCRIPTION OF THE DRAWINGS

The present disclosure will now be explained in greater detail based on the appended drawing, the sole FIG. 1 of which shows as follows:

FIG. 1 shows a schematic view of a process measuring system.

DETAILED DESCRIPTION

The process measuring system P includes a first field device F1 having at least a first clock signal generator T1 and at least two other field devices F2, F3 each having at least one clock signal generator T2, T3. Shown in FIG. 1, by way of example, are three other field devices F2, F3, F4. The more other field devices F2, F3, F4 are applied in the method of the invention, the better, in order that the at least first clock signal generator T1 can be checked in greater detail. Each of the field devices F1, F2, F3, F4 determines and/or monitors at least one chemical and/or physical parameter of a medium. A non-limiting selection of field devices has been mentioned above. The method of the invention is especially advantageous for the first field device F1, which determines and/or monitors at least one chemical and/or physical parameter of the medium at least by means of the at least first clock signal generator T1. The first field device F1 can be, for example, a density measuring device, a flow measuring device or a travel time fill level measuring device.

Each clock signal generator T1, T2, T3, T4 produces an actual frequency and has a predetermined, desired frequency. The first field device F1 is embodied to exchange information with the at least two other field devices. For such purpose, the at least three field devices F1, F2, F3, F4 have, for example, correspondingly embodied transmitting units (not shown). The double arrows in FIG. 1 indicate information exchange between the field devices.

In a first step of the first method of the invention, a produced, actual frequency and the predetermined, desired frequency of the first clock signal generator T1 are transmitted to the at least two other field devices F2, F3. Then, deviations of the actual frequency from the desired frequency of the at least first clock signal generator T1 are ascertained by means of the clock signal generators T2, T3 of the at least two other field devices F2, F3. The ascertained deviations are then transmitted to the first field device F1. In a next step, the ascertained deviations and/or an average value of the ascertained deviations are compared with a predetermined tolerance range of the desired frequency of the at least first clock signal generator T1 and, finally, at least one piece of state information concerning the at least first clock signal generator T1 is output based on comparison. For example, the first field device F1 can have a computing unit (not shown), which is embodied to perform the comparison and, based on the comparison, to output at least one piece of state information concerning the at least first clock signal generator T1. The predetermined tolerance range of the at least first clock signal generator T1 is, for example, an accuracy class of the first clock signal generator T1.

Furthermore, it is optionally possible to weight each ascertained deviation, for example, as a function of the field device F2, F3, by which it was ascertained or as a function of a piece of state information of the field device F2, F3, by which it was ascertained. Used as state information of the field device F2, F3 are/is, for example, a time period since the last calibration of the clock of the field device and/or the presence of a failure and/or a need for maintaining the field device. In this way, inaccuracies of the clock signal generators T2, T3 present in the at least two other field devices F2, F3 can optionally be taken into consideration in the method step of comparing.

As at least one piece of state information concerning the first clock signal generator T1, a warning can be output, when the ascertained deviations and/or the average value of the ascertained deviations lie outside of the predetermined tolerance range of the desired frequency. Additionally or alternatively as at least one piece of state information concerning the at least first clock signal generator T1, a correction factor can be output, which gives the degree, with which the at least first clock signal generator T1 differs from the predetermined tolerance range. Additionally as at least one piece of state information concerning the at least first clock signal generator T1, a remaining function length of time of the at least first clock signal generator T1 can be output, after the expiration of which the ascertained deviations and/or the average value of the ascertained deviations will lie outside of the predetermined tolerance range.

Furthermore, the actual frequency of the at least first clock signal generator T1 can be corrected to the desired frequency with the help of the ascertained deviations and/or the average value of the ascertained deviations and/or the correction factor.

In the first step of the second method of the invention, an actual frequency of the at least first clock signal generator T1 is produced, which is then transmitted to the at least two other field devices F2, F3. In the next step, the at least two other field devices F2, F3 check the actual frequency of the at least first clock signal generator T1 by means of their clock signal generators. As a result of this checking, in each case, a reference frequency of the at least first clock signal generator T1 is determined, which is then transmitted to the first field device F1. Subsequently, in each case, a deviation of the reference frequency from the desired frequency of the at least first clock signal generator T1 is ascertained. Thereafter, the ascertained deviations and/or an average value of the ascertained deviations are compared with a predetermined tolerance range of the desired frequency of the at least first clock signal generator T1 and, finally, at least one piece of state information concerning the first clock signal generator T1 is output based on the comparison. The embodiments of the first method of the invention hold mutatis mutandis also for the second method of the invention.

The invention claimed is:

1. A method for checking a first clock signal generator of a first field device in a process measuring system, wherein the process measuring system includes the first field device and at least two other field devices having, in each case, a clock signal generator, wherein the first field device and the at least two other field devices each determines and/or monitors at least one chemical and/or physical parameter of a medium, wherein a desired frequency is predetermined for each clock signal generator and each clock signal generator produces an actual frequency, wherein the first field device is embodied to exchange information with the at least two other field devices, the method comprising:

producing the actual frequency of the first clock signal generator;

transmitting the produced actual frequency and the desired frequency of the first clock signal generator to the at least two other field devices;

ascertaining deviations of the actual frequency from the desired frequency of the first clock signal generator via the clock signal generators of the at least two other field devices;

transmitting the ascertained deviations to the first field device;

comparing the ascertained deviations and/or an average value of the ascertained deviations with a predetermined tolerance range of the desired frequency of the first clock signal generator; and outputting at least one piece of state information concerning the first clock signal generator based on the comparison.

2. The method as claimed in claim 1, wherein a warning is output as the at least one piece of state information concerning the at least first clock signal generator, when the ascertained deviations and/or the average value of the ascertained deviations lie outside of the predetermined tolerance range of the desired frequency.

3. The method as claimed in claim 1, further comprising:

outputting a correction factor as the at least one piece of state information concerning the first clock signal generator, wherein the correction factor gives a degree with which the first clock signal generator differs from the predetermined tolerance range.

4. The method as claimed in claim 3, further comprising:
correcting the actual frequency of the first clock signal generator to the desired frequency with the help of the ascertained deviations and/or the average value of the ascertained deviations and/or the correction factor.

5. The method as claimed in claim 1, further comprising:
outputting as the at least one piece of state information concerning the first clock signal generator a remaining function length of time of the first clock signal generator after an expiration of which the ascertained deviations and/or the average value of the ascertained deviations will lie outside of the predetermined tolerance range.

6. The method as claimed in claim 1,
wherein the first field device determines and/or monitors at least one chemical and/or physical parameter of the medium at least via the first clock signal generator.

7. The method as claimed in claim 1, further comprising:
weighting each ascertained deviation as a function of the field device by which it was ascertained.

8. The method as claimed in claim 1,
weighting each ascertained deviation as a function of a piece of state information of the field device by which it was ascertained.

9. The method as claimed in claim 8,
wherein used as state information of the field device are/is a time period since last calibration of the clock signal generator of the field device and/or the presence of a failure and/or a need for maintaining the field device and/or an accuracy class of the at least one clock signal generator of the field device.

10. The method as claimed in claim 1,
wherein an accuracy class of the first clock signal generator is used as the predetermined tolerance range of the at least first clock signal generator.

11. The method as claimed in claim 1,
wherein the first field device is a density measuring device, a flow measuring device, or a travel time fill level measuring device.

12. A method for checking a first clock signal generator of a first field device in a process measuring system, wherein the process measuring system includes the first field device and at least two other field devices having, in each case, at least one clock signal generator, wherein the first field device and the at least two other field devices each determines and/or monitors at least one chemical and/or physical parameter of a medium, wherein a desired frequency is predetermined for each clock signal generator and each clock signal generator produces an actual frequency, wherein the first field device is embodied to exchange information with the at least two other field devices, the method comprising:

producing an actual frequency of the first clock signal generator;

transmitting the produced actual frequency of the first clock signal generator to the at least two other field devices;

checking the actual frequency of the first clock signal generator via the clock signal generators of the at least two other field devices;

determining reference frequencies of the first clock signal generator as a result of checking the actual frequency of the first clock signal generator;

transmitting the reference frequencies to the first field device;

ascertaining deviations of the reference frequencies from the desired frequency of the first clock signal generator, comparing the ascertained deviations and/or an average value of the ascertained deviations with a predetermined tolerance range of the desired frequency of the first clock signal generator; and outputting at least one piece of state information concerning the at least first clock signal generator based on the comparison.

* * * * *